United States Patent [19]

Nelson et al.

[11] 4,118,756
[45] Oct. 3, 1978

[54] HEAT PIPE THERMAL MOUNTING PLATE FOR COOLING ELECTRONIC CIRCUIT CARDS

[75] Inventors: Lloyd A. Nelson, Villa Parks; Kalwant S. Sekhon, Fullerton, both of Calif.

[73] Assignee: Hughes Aircraft Company, Culver City, Calif.

[21] Appl. No.: 787,246

[22] Filed: Apr. 14, 1977

Related U.S. Application Data

[63] Continuation of Ser. No. 559,353, Mar. 17, 1975, abandoned.

[51] Int. Cl.$^2$ .............................................. H01L 23/46
[52] U.S. Cl. ................................. 361/385; 165/105; 357/82; 361/388
[58] Field of Search ...................... 165/105; 357/82; 361/388, 385

[56] References Cited

U.S. PATENT DOCUMENTS

| | | | |
|---|---|---|---|
| 3,651,865 | 3/1972 | Feldmanis | 165/105 X |
| 3,680,189 | 8/1972 | Noren | 165/105 X |
| 3,822,743 | 7/1974 | Waters | 165/105 |
| 3,901,311 | 8/1975 | Kosson et al. | 165/105 |

*Primary Examiner*—Albert W. Davis, Jr.
*Attorney, Agent, or Firm*—Lewis B. Sternfels; W. H. MacAllister

[57] ABSTRACT

Heat pipe technology may be utilized to cool circuit card-mounted electronic components. A heat pipe thermal mounting pipe has a very high thermal conductivity and provides a relatively uniform temperature surface for attaching of circuit card-mounted electronic components. It comprises thin evaporator and condenser wicks (for low temperature gradients) as well as a relatively porous sintered metal artery wick (for high heat transfer capability). The heat sink or other heat exchanger may be mounted at the edge of the thermal mounting plate in the vicinity of the condenser wick. The electronic components are mounted in the vicinity of the evaporator wicks.

10 Claims, 3 Drawing Figures

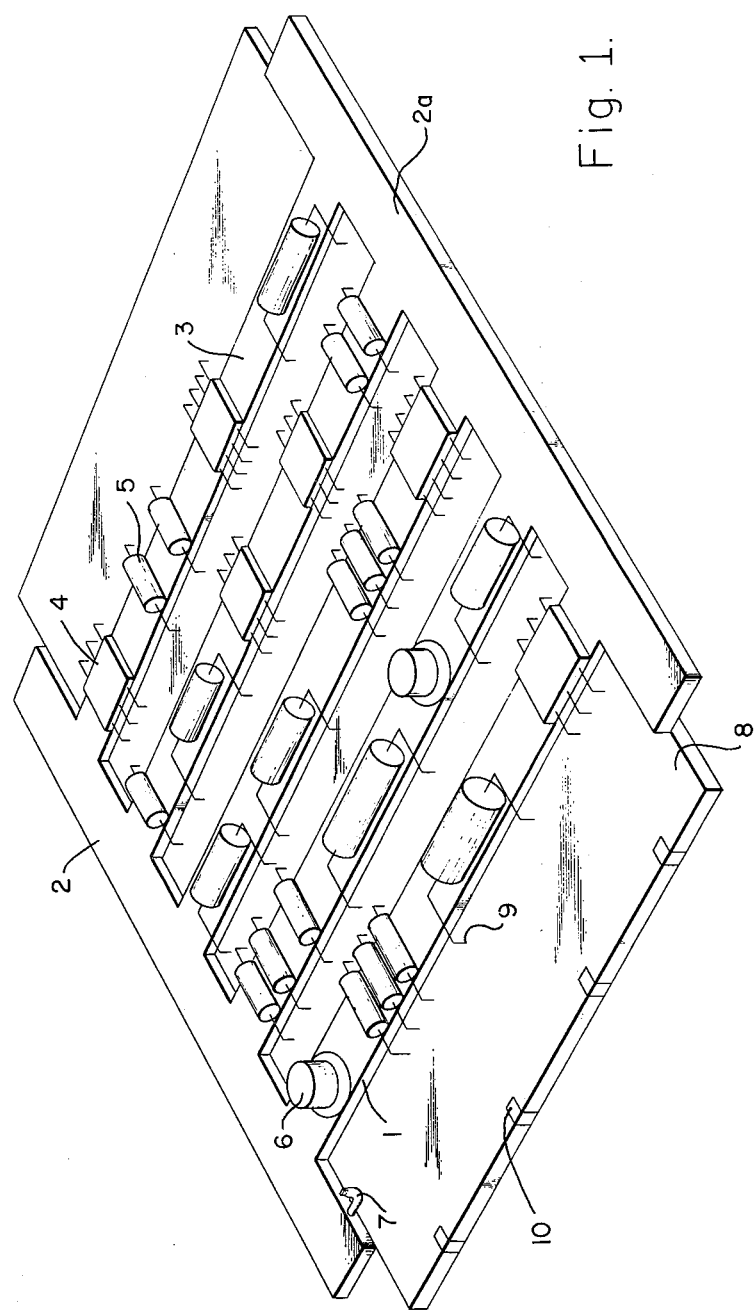

HEAT PIPE THERMAL MOUNTING PLATE FOR COOLING ELECTRONIC CIRCUIT CARDS

This is a continuation of application Ser. No. 559,353 filed Mar. 17, 1975 now abandoned.

FIELD OF THE INVENTION

This invention relates generally to the cooling of electronic or other components and in particular to the utilization of heat pipe technology directed to such an end.

BACKGROUND OF THE INVENTION

The conventional approach to cooling of card-mounted electronic components is to use solid metal thermal mounting plates which conduct the heat dissipated by the components to a heat sink disposed at an edge of each plate. Such an approach results in high thermal gradients and high component temperatures, especially for those components which dissipate high power.

Heat pipes have been proposed for cooling individual electronic components. (See, for example, the article "Transient Thermal Impedance Of A Water Heat Pipe," by S. W. Kessler, Jr., and presented at the ASME Winter Annual Meeting, Washington D.C., Nov. 28 through Dec. 2, 1971.) However, the prior art heat pipes use the same wicks for fluid transport as for heat transfer, requiring a compromise between the overall thermal conductance of the heat pipe and the heat transfer capacity; furthermore, they were not of a configuration which was readily adaptable to the cooling of components mounted on circuit cards.

SUMMARY OF THE PRESENT INVENTION

Accordingly, one object of the present invention is to provide a thermal mounting plate provided with a heat pipe for thermal transfer, thereby providing essentially uniform cooling for all card-mounted electronic components regardless of location.

Another object of the present invention is to provide an almost uniform mounting plate temperature for all electronic components regardless of power dissipation.

Yet another object of the present invention is to provide a lower mounting surface temperature than can be provided with solid metallic thermal mounting plates.

Yet another object of the present invention is to provide a heat pipe of a configuration suitable for use with card-mounted electronic components.

A particular object of the present invention is to provide a heat pipe thermal mounting plate which is provided with relatively porous artery wicks in order to obtain high total heat transfer and with evaporator and condenser wicks of a configuration which gives high thermal conductivity.

BRIEF DESCRIPTION OF THE DRAWINGS

For a better understanding of the present invention, reference is made to the following detailed description of a preferred embodiment and the accompanying figures in which:

FIG. 1 illustrates a heat pipe thermal mounting plate in accordance with one preferred embodiment of the present invention;

DETAILED DESCRIPTION OF THE PREFERRED EMBODIMENT

Figure 3:
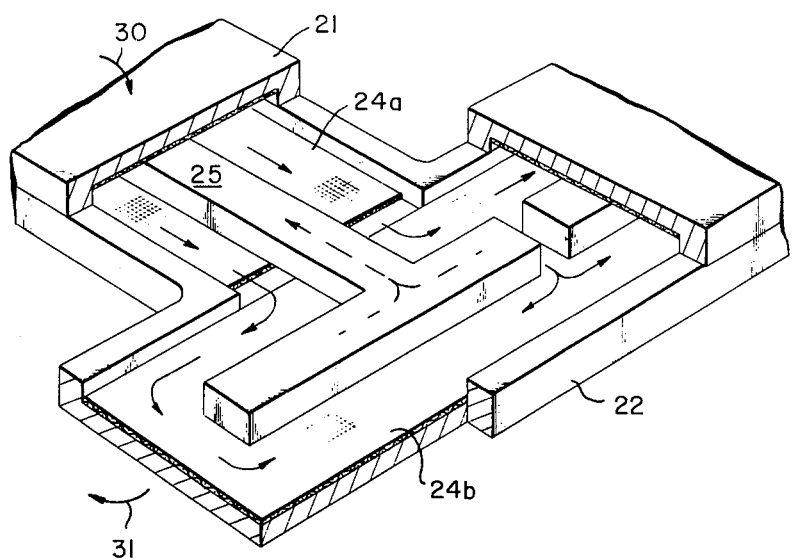
FIG. 3 is a cut-away drawing of one corner of the thermal mounting plate of FIG. 1 in which the heat, vapor and fluid flow paths are all clearly visible.

Increases in the sophistication of electronic systems requires denser packaging of electronic components with attendant increases in power density and total card power. Further increases in packaging density requirements cannot be met by conventional component cooling techniques. Heat pipes which use an evaporation-condensation cycle of a working fluid powered by capillary forces are not constrained by conventional conduction cooling limitations and can therefore be used to provide more efficient cooling and thus permit higher power density and higher total card power. From this, significant weight and space savings result which are particularly desirable for military and aerospace applications. For example, in the case of a particular high power density card rack for an aerospace electro-magnetic counter-measure system, it was estimated that the use of heat pipes will reduce the size and weight of the system to approximately one-third. There are also cost savings associated with the possibility of using low power components as a result of the less severe thermal environment which results.

Referring now with particularity to FIG. 1, it may be seen that the heat pipe thermal mounting plate in accordance with the present invention may comprise a plurality of heat pipe connection bars 1 connected at either end to thermal joint areas 2 and 2a which may be connected to a heat sink or other conventional cooling means. Mounted on the flat upper surface 3 of conduction bar 1 may be, for instance, flat packs 4, individual components such as resistor 5, or individual semi-conductive devices 6. The heat pipe thermal mounting plate is also provided with a full tube 7 through which the working fluid (not visible) may be introduced. The surfaces upon which the components are mounted (for example, upper surface 3 of FIG. 1) are preferably flat in construction in order to provide for the greatest possible area of contact between the electronic components and the heat pipe structure. The components are bonded to the heat pipe thermal mounting plate in order to provide for both structural strength and efficient thermal conduction.

Also visible in FIG. 1 is the upper surface of a circuit card 8 through which leads from the various components, etc. pass through via holes 9 to the other side of the circuit board where they are soldered to printed circuits (not visible) thereby effecting the circuit connections between the various elements. At one edge of the circuit card, there is provided an electrical connector 10 for making connection to the plurality of inputs and outputs associated with the particular circuit card.

Figure 2:
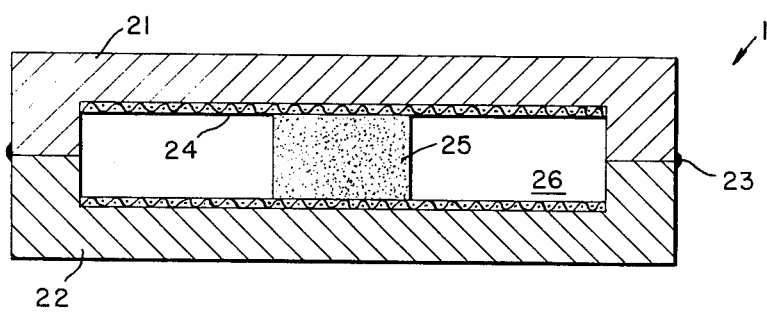
FIG. 2 is a cross-section through one of the heat pipe conduction bars of the thermal mounting plate of FIG. 1.

Referring now to FIG. 2 which illustrates in cross-section one of the conduction bars of FIG. 1, it may be seen that the thermal mounting plate comprises an upper portion 21 and a lower portion 22 braised together at their joint 23. The conduction bar is of hollow construction and contains inside a thin, stainless steel mesh evaporator wick 24 as well as an artery wick 25 fabricated from relatively porous sintered metal. The use of thin stainless steel screen or other similar wick material provides a short heat transfer path from the shell 21 to a vapor space 26 thereby providing a low thermal resistance between the electronic components mounted on the top of the shell and the working fluid itself.

In general, the functions of a heat pipe wick are to provide the capillary pumping capability for fluid circulation, a path for condensate return to the evaporator, and a sufficiently high thermal conductance path between the container wall and the liquid-vapor interface. The limiting heat flux from the heat pipe will generally be determined by one of the foregoing parameters, the first two of which being associated with limitations on the axial transfer capability, and the third being associated with the heat transfer limit.

The parameters which characterize the wick structure are the mean pore radius, permeability of the wick, volumetric porosity, and wick thickness. The value of these parameters must match the specific pump requirements for a particular heat pipe application. For optimum pore size, the trade-off between maximizing the pumping capacity and minimizing the liquid pressure drop must be performed. Decreasing the pore size increases the pumping capability but simultaneously increases the liquid flow resistance. Conversely, increasing pore sizes reduces the flow resistance but also reduces the pumping capability.

In addition to the parameters which characterize the wick structure, several other factors must be considered in proper wick selection. Porous material can act as a wick only if it is wetted by the liquid. For some materials, the wetability is inhibited by surface contaminants. Materials such as felt and woven fiber glass textiles may swell up on absorbing liquid or become compressed by capillary forces at the liquid-vapor interface, thereby affecting the pore size of the wick material. Furthermore, non-metallic materials will not generally provide the high thermal conductivity necessary for minimization of temperature gradients.

Since only wetting fluids can be pumped by capillary action, the first requirement for a heat pipe fluid is that it wet the wick. It is also desirable for the working fluid to wet the container wall. The fluid should also be non-corrosive to the wick and the container and should be chemically stable during long-term use within its operating temperature range. In selecting fluids, the following equation for the figure of merit P associated with the fluid properties related to the fluid transport mechanism in the case where gravity is not a factor is:

$$P = (\rho \lambda \gamma / \mu)$$

where:
$\rho$ = density of the liquid
$\lambda$ = latent heat of vaporization
$\gamma$ = surface tension
$\mu$ = viscosity of the liquid From this equation, it can be seen that the fluid should be used at a temperature which is considerably below the critical temperature and considerably above the freezing point. The equation also indicates that density, heat of vaporization, and surface tension should be as large as possible, while the viscosity should be as low as possible. Inasmuch as the kinematic viscosities ($\mu/\rho$) of most liquids are the same to an order of magnitude, it becomes obvious that a fluid having a high surface tension (thereby permitting adequate pumping capability without requiring the use of excessively small capillary pores) and having a large heat of vaporization (thereby permitting high heat transport rates with minimum mass flow rates) is what is required.

Good working fluids for high temperature applications are the alkali metals (lithium, sodium, etc.) In the temperature range of from about 20° C. to 200° C. water, methanol and benzene are all useful. Ammonia is especially good at low temperature ranges, say between − 50° C. and + 50° C.

Based upon the foregoing considerations, in one particular embodiment of the present invention, the shell was made of copper, and the wicks of copper screening. Water was used as the heat pipe fluid. The thermal mounting plate was approximately 5 inches by 5 inches in size. Five watts of dissipated power resulted in a temperature drop from the center to the edge of less than 1° C. (compared to a 10° C. drop for a conventional solid aluminum mounting plate).

In a second embodiment of the present invention, the shell was constructed of hardened beryllium copper for rugged mechanical strength as well as excellent thermal conductivity and material compatibility properties. The evaporator and condenser wicks were made of fine mesh stainless steel screening, and fiber metal was used for the artery wicks. Twenty-four watts of heat dissipation resulted in a measured temperature drop of less than 5° C. The calculated drop for a conventional aluminum thermal mounting plate is 20° C.

Referring now to FIG. 3 which represents a cutaway view of a portion of the heat pipe thermal mounting plate of FIG. 1 and illustrates the heat, fluid and vapor flow paths in the heat pipe, it may be seen that the fluid cycle starts at the evaporator portion where the heat dissipating electronic components are mounted. The heat 30 from these components passes through shell 21 to the evaporator wick 24a which, in the embodiment illustrated, is a fine stainless steel mesh bonded to the inner surface of the shell. Heat 30 causes the working fluid to evaporate in the vicinity of evaporator wick 24a into a vapor which flows through space 26 (see FIG. 2) to the condenser area associated with the thermal joint areas 2 and 2a (FIG. 1). These condenser areas are provided with condenser wicks 24b (also stainless steel mesh construction), and the latent heat of vaporization is released by the fluid as it condenses. The condensed liquid flows through the condenser wick to the artery wick 25 and thence (by means of capillary action) back to the evaporator portion and into the evaporator wick where the fluid cycle is started once again. The heat 31 released by the condensing vapor goes to an external heat sink connected to the aforesaid thermal joint areas. The artery wick, as has been mentioned previously, is designed to provide high flow capacity which permits high total heat transfer. It may be relatively thick thereby providing this capacity without requiring unduly high pressure drops. The evaporator and condenser wicks are thin in order to improve the transfer of heat from the shell to the fluid-vapor interface and vice-versa; furthermore the stainless steel (or whatever material is chosen) should have a higher thermal conductivity than the fluid itself and therefore further improves the thermal conductivity.

It should be noted that careful selection of fabrication techniques is required in order to assure the satisfactory operation and lifetime of a device constructed in accordance with the present invention. Our experience has shown that the metal joining phase of heat pipe fabrication is especially critical and that the heat pipe must be assembled in clean-room facilities with particular attention being made to the cleaning of the inside of the heat pipe. The upper and lower portions of the heat pipe shell may be formed by means of chemically etching a sheet of beryllium copper of the appropriate thickness. Solder may then be plated on the surfaces forming the joint between the two shell halves, and standard bonding techniques may be used to solder the halves into a fluid-tight shell.

At this point, it should be noted that good contact between the wick and the heat pipe is important for the maximization of the overall thermal conductancce. If the wick is not in thermal contact with the shell, then a thin layer of heat pipe fluid (having a significantly higher thermal resistance) is present in the heat flow path and therefore there is a higher temperature drop. The stainless steel mesh evaporator and condensor wicks may be spot-welded in place to achieve this good contact. The sintered metal artery wicks may be made slightly oversize so that they are pressed against the evaporator and condenser wicks when the heat pipe is assembled, or alternatively they may be bonded by sintering the powdered metal in place in the heat pipe prior to final assembly.

The final assembly steps are welding the two shell halves together, ridding the assembly of contaminants, filling the assembly with enough working fluid to saturate the wicks, and sealing the heat pipe by pinching off the fill-tube.

From the foregoing detailed description, it will be seen that a heat pipe thermal mounting plate in accordance with the present invention offers many advantages over prior art thermal mounting plates. In particular, the low temperature gradient from the center to the edge of the card permits the designer more freedom in optimal component layout and in the use of single components having high power dissipation densities; furthermore, it is no longer necessary to split related functions between several cards merely because of the thermal characteristics of the components involved. It should also be pointed out that the heat pipe thermal mounting plate of the present invention is compatible with existing systems inasmuch as it may be used with existing heat sinks connected to the edge of the card.

Although we have described in detail a preferred embodiment of our invention and given several alternatives to the materials used and the mode of construction, nevertheless it will be seen that there exist other variations obvious to those skilled in the art which fall within the spirit of our invention.

What we claim is:

1. An electronic module with an integral heat pipe thermal mounting plate comprising in combination:
    means for defining at least one electronic circuit card;
    means for defining heat dissipating electronic components electrically coupled to said circuit card means;
    means for defining an electric connector extending at least along an edge of said circuit card means in electrical connection with said electronic components means;
    a thermal joint area for connection to an external heat sink;
    at least one conduction bar extending from said thermal joint area and provided with means for mounting said heat dissipating electronic components means in direct heat transfer connection;
    a thin condenser wick disposed within a hollow portion inside said thermal joint area and thermally bonded thereto;
    a thin evaporator wick disposed within a hollow portion inside said conduction bar and thermally bonded thereto, said condenser wick and said evaporator wick having means designed therein for optimizing thermal conductivity from said heat dissipating components means to the fluid-vapor interface of a heat pipe working fluid saturating said wicks;
    an uninterrupted vapor flow path from said conduction bar hollow portion to said thermal joint hollow portion; and
    an artery wick extending from said thermal joint hollow portion to said conduction bar hollow portion for providing a high flow rate for said heat pipe working fluid from said condenser wick to said evaporator wick.

2. The module with integral thermal mounting plate of claim 1 further comprising additional spaced apart conduction bars further mounting said electronic components means in the heat transfer connection, the whole of said thermal mounting plate being of substantially flat construction.

3. The module with integral thermal mounting plate of claim 2 wherein said thermal joint area comprises a pair of spaced, substantially parallel conduction members each having said condenser wicks and a portion of said artery wick therein, wherein said spaced apart conduction bars extend in integral mechanical and thermal connection to and substantially at right angles from and between said conduction members, and wherein said electronic components means are thermally secured to said conduction bars on one side thereof and said circuit card means is secured on the other side thereof to form a flat sandwich configuration with leads from said electronic components means extending between said conduction bars for electrical connection to said circuit card means.

4. The module with integral thermal mounting plate of claim 1 wherein said evaporator wick and said condenser wick are each constructed of a fine metallic mesh having a relatively high resistance to fluid flow and for optimizing heat transfer and wherein said artery wick has a more open pore structure for providing a lower resistance path for fluid flow.

5. The module with integral thermal mounting plate of claim 4 wherein said artery wick is formed from sintered metal fiber.

6. An electronic module with an integral heat pipe thermal mounting plate comprising in combination:
    means for defining at least one electronic circuit card;
    means for defining heat dissipating electronic components electrically coupled to said circuit card means;
    means for defining an electric connector coupled to said circuit card means in electrical connection with said electronic components means;
    first heat pipe means with condenser wicking configured as a thermal joint area for connection to an external heat sink; and
    second heat pipe means with evaporator wicking configured as at least one conduction bar which extends from said thermal joint area and which is provided with means for mounting said heat dissipating electronic components means in heat transfer connection therewith.

7. The module of claim 6 wherein:

both said first and second heat pipe means include a shell defining a vapor tight space with a working fluid therein;

said second heat pipe means includes a thin evaporator wick configured as said evaporator wicking and having means for effecting a low thermal resistance and a high resistance to fluid flow and disposed within a first portion of said space and thermally bonded to at least one part of said shell;

said first heat pipe means includes a thin condenser wick configured as said condenser wicking and also having means for effecting a low thermal resistance and disposed within a second portion of said space; and both said first and second heat pipe means include a relatively thick porous and continuous artery wick contacting portions of both said condenser wick and said evaporator wick and having means for providing a low resistance path for liquid flow from said condenser wick to said evaporator wick and for providing a space for vapor flow from said evaporator wick to said condenser wick.

8. The module of claim 7 wherein said artery wick is constructed from sintered fiber metal and has a more porous structure than said evaporator and condenser wicks but which still has a pore size sufficiently small for providing for capillary pumping of said working fluid from said condenser wick to said evaporator wick.

9. The module of claim 7 wherein said shell includes upper and lower surfaces and said artery wick is approximately the same thickness as the distance between said upper and lower shell surfaces for pressing into said evaporator and condenser wicks, thereby for enabling facile fluid flow between said evaporator and condenser wicks and said artery wick.

10. The module of claim 9 wherein said shell comprises upper and lower sections bonded together and has a substantially rectangular cross-section.

* * * * *